(12) United States Patent
Kapoor

(10) Patent No.: US 7,691,702 B2
(45) Date of Patent: Apr. 6, 2010

(54) METHOD OF MANUFACTURE OF AN APPARATUS FOR INCREASING STABILITY OF MOS MEMORY CELLS

(75) Inventor: Ashok Kumar Kapoor, Palo Alto, CA (US)

(73) Assignee: Semi Solutions, LLC, Los Gatos, CA (US)

( * ) Notice: Subject to any disclaimer, the term of this patent is extended or adjusted under 35 U.S.C. 154(b) by 0 days.

(21) Appl. No.: 12/109,327

(22) Filed: Apr. 24, 2008

(65) Prior Publication Data

US 2008/0233685 A1    Sep. 25, 2008

Related U.S. Application Data

(62) Division of application No. 11/027,181, filed on Dec. 29, 2004, now Pat. No. 7,375,402.

(60) Provisional application No. 60/601,979, filed on Aug. 17, 2004, provisional application No. 60/585,582, filed on Jul. 7, 2004.

(51) Int. Cl.
 H01L 21/8239   (2006.01)
(52) U.S. Cl. .............................. 438/237; 257/E21.645
(58) Field of Classification Search ................ 438/237; 257/E21.645
 See application file for complete search history.

(56) References Cited

U.S. PATENT DOCUMENTS

| | | | |
|---|---|---|---|
| 3,921,035 A | 11/1975 | Holmes | |
| 4,412,308 A | 10/1983 | Bergeron | |
| 5,365,102 A | 11/1994 | Mehrotra et al. | |
| 5,416,443 A | 5/1995 | Cranford et al. | |
| 5,559,451 A | 9/1996 | Okamura | |
| 5,753,955 A | 5/1998 | Fechner | |
| 5,760,449 A | 6/1998 | Welch | |
| 5,763,960 A | 6/1998 | Ceccherelli et al. | |
| 5,821,769 A | 10/1998 | Douseki ...................... 326/34 |
| 6,018,168 A | 1/2000 | Yang ......................... 257/207 |
| 6,034,563 A | 3/2000 | Mashiko | |
| 6,081,107 A | 6/2000 | Marino | |
| 6,177,703 B1 | 1/2001 | Cunningham | |

(Continued)

OTHER PUBLICATIONS

Borkar, S. Circuit Techniques for Subthreshold Leakage avoidance, Control, and Tolerance. IEEE. 2004.

(Continued)

*Primary Examiner*—Jerome Jackson, Jr.
*Assistant Examiner*—Paul A Budd
(74) *Attorney, Agent, or Firm*—Michael A. Glenn; Glenn Patent Group

(57) ABSTRACT

In deep submicron memory arrays there is noted a relatively steady on current value and, therefore, threshold values of the transistors comprising the memory cell are reduced. This, in turn, results in an increase in the leakage current of the memory cell. With the use of an ever increasing number of memory cells leakage current must be controlled. A method of manufacture of a dynamic threshold voltage control scheme implemented with no more than minor changes to the existing MOS process technology is disclosed. The disclosed invention controls the threshold voltage of MOS transistors. Methods for enhancing the impact of the dynamic threshold control technology using this apparatus are also included. The invention is particularly useful for SRAM, DRAM, and NVM devices.

13 Claims, 8 Drawing Sheets

U.S. PATENT DOCUMENTS

| | | |
|---|---|---|
| 6,194,276 B1 | 2/2001 | Chan et al. |
| 6,198,173 B1 | 3/2001 | Huang |
| 6,204,105 B1 | 3/2001 | Jung |
| 6,225,827 B1 | 5/2001 | Fujii et al. |
| 6,294,816 B1 | 9/2001 | Baukus et al. |
| 6,359,477 B1 | 3/2002 | Pathak |
| 6,384,639 B1 | 5/2002 | Chen et al. |
| 6,411,560 B1 | 6/2002 | Tanizaki et al. |
| 6,429,482 B1 | 8/2002 | Culp et al. |
| 6,441,647 B2 | 8/2002 | Jeon |
| 6,465,849 B1 | 10/2002 | Chang et al. |
| 6,521,948 B2 | 2/2003 | Ebina |
| 6,593,799 B2 | 7/2003 | De et al. |
| 6,600,187 B2 | 7/2003 | Kim |
| 6,621,292 B2 | 9/2003 | Sakata et al. |
| 6,628,551 B2 | 9/2003 | Jain |
| 6,643,199 B1 | 11/2003 | Tang et al. |
| 6,674,123 B2 | 1/2004 | Kim |
| 6,690,039 B1 | 2/2004 | Nemati et al. |
| 6,693,333 B1 | 2/2004 | Yu |
| 6,707,708 B1 | 3/2004 | Alvandpour et al. |
| 6,711,063 B1 | 3/2004 | Dejenfelt et al. |
| 6,711,088 B2 | 3/2004 | Hayashi et al. |
| 6,787,850 B1 | 9/2004 | Pelloie |
| 6,891,389 B1 | 5/2005 | Walker et al. |
| 6,894,324 B2 | 5/2005 | Ker et al. |
| 6,898,116 B2 | 5/2005 | Peng |
| 6,940,317 B2 | 9/2005 | Suga |
| 6,958,519 B2 | 10/2005 | Gonzalez et al. |
| 6,969,888 B2 | 11/2005 | Williams et al. |
| 7,064,942 B2 | 6/2006 | Ker et al. ............ 361/56 |
| 7,132,711 B2 | 11/2006 | Forbes et al. |
| 7,253,485 B2 | 8/2007 | Shibahara |
| 2001/0054886 A1 | 12/2001 | Takahashi et al. |
| 2002/0031028 A1* | 3/2002 | Forbes et al. ........... 365/207 |
| 2002/0096723 A1 | 7/2002 | Awaka |
| 2002/0153957 A1 | 10/2002 | Jordanov |
| 2002/0154462 A1 | 10/2002 | Ker et al. |
| 2002/0195623 A1 | 12/2002 | Horiuchi |
| 2003/0089951 A1 | 5/2003 | Ker et al. |
| 2003/0178648 A1 | 9/2003 | Bansal ............... 257/202 |
| 2004/0004298 A1 | 1/2004 | Madurawe |
| 2004/0022109 A1 | 2/2004 | Yoon et al. |
| 2004/0077151 A1 | 4/2004 | Bhattacharyya |
| 2004/0252546 A1 | 12/2004 | Liaw |
| 2005/0035410 A1 | 2/2005 | Yeo et al. |

OTHER PUBLICATIONS

Vora, M. et al; "A 2 Micron High Performance Bipolar 64K ECL Static RAM Technology With 200 Square Microns Contactless Memory Cell", IEDM Technical Digest 1984, pp. 690-693.

Bohr, m. High Performance Logic Technology and Reliability Challenges, 203 IPRS. Apr. 1, 2003.

Fallah, et al. Standby and Active Leakage Current Control and Minimization in CMOS VLSI Circuits. IEICE Trans. On Electronics, Special Section on Low-Power LSO and Low Power IP. vol. E88-C, No. 4, Apr. 2004.

Cao, et al. Reducing Dynamic Power and Leakage Power for Embedded Systems, ASIC-SOC Conference, 2002, 15th Annual IEEE International vol. Uss. Sep. 2002.

Min, et al. Zigzag Super Cut-Off CMOS (ZSCCMOS) Block Activation with Self-Adaptive Voltage Level Controller: An Alternative to Clock-Gating Scheme in Leakage Dominant Era. Solid-State Circuits Conference 2003. Digest of Technical Papers. ISSCC 2003 IEEE International vol. Iss 2003.

Henzler, et al. Fast Power-Efficient circuit-Block Switch-Off Scheme, Electronics Letters, vol. 40 Iss 2. Jan. 22, 2004.

Narendra,, et al. Full Chip Subthreshold Leakage Power Predictin and Reduction techniques for sub-0.18um CMOS. Solid-State circuits. IEEE Journal of vol. 39. Iss.3. Mar. 2004.

Kao, et al. Dual-Threshold Voltage Techniques for Low-Power Digital Circuits, Solid-State Circuits. IEEE Journal, vol. 35, Iss. 7, Jul. 2000.

Kuroda, et al. A 0.9-V, 150MHz, 10-mW, 4mm2, 2-D Discrete Cosine Transform Core Processor with Variable Threshold-Voltage (VT) Scheme, Solid-State Circuits, IEEE Journal vol. 31. Iss. 11, Nov. 1996.

Tschanz, et al. Adaptive Body Bias for Reducing Impacts of Die-to-Die and within—die Parameter Variations on Microprocessor Frequency and Leakage. Solid State Circuits Conference, 2002. Digest of Technical Papers. ISSCC. 2002 IEEE Internationl . vol. 1. Iss. Feb 2002.

Von Arnim, et al. Efficiency of Body Biasing in 90-nm CMOS for Low-Power Digital Circuits. Solid State Circuits. IEEE Journal. vol. 40. Iss. 7, Jul. 2005.

Takamiya, M. and Hiramoto, T.: "High Performance Electrically Induced Body Dynamic Threshold SOI MOSFET (EIB-DTMOS) with Large Body Effect and Low Threshold Voltage" IEDM Technical Digest 1998.

Diaz, C.H. et al.; "Device Properties in 90nm and beyond and implications on Circuit Design", IEEE 2003.

Rabaey, J. "Issues in Low Power Design—Managing Leakage", Dept of Electrical Engineering and Computer Sciences, Univ. of CA—Berkeley, Aug. 23, 2004.

* cited by examiner

US 7,691,702 B2

METHOD OF MANUFACTURE OF AN APPARATUS FOR INCREASING STABILITY OF MOS MEMORY CELLS

CROSS REFERENCE TO RELATED APPLICATIONS

This application is a divisional application from U.S. patent application Ser. No. 11/027,181 filed on Dec. 29, 2004 now U.S. Pat. No. 7,375,402, now allowed, that further claims priority to U.S. provisional patent application Ser. No. 60/601,979, filed 17 Aug. 2004, 60/585,582, filed 7 Jul. 2004, which documents are incorporated herein in their entirety by this reference thereto.

BACKGROUND OF THE INVENTION

1. Technical Field

The invention relates generally to MOS based memory cells. More specifically, the invention relates to the improvement of leakage of memory cells using deep submicron MOS transistors.

2. Description of the Prior Art

Conventional complementary metal-oxide semiconductor (CMOS) technology currently poses some difficult problems as the minimum feature size shrinks to below 100 nanometers and power supply voltage is reduced to less than 1.0V. A typical layout of a 0.18 micron transistor 100 is shown in FIG. 1. The transistor is manufactured over a well 110 where a diffusion area 120 is created. The gate 130 of the transistor 100 is formed over an island 120, and has a length "L" and width "w." For example, 0.18 micron is the minimum gate length for a transistor in a 0.18 micron technology, with the width of the transistor varying for different circuit applications. Contacts 140 and 141 comprise one terminal of the NMOS transistor, for example the drain, and a contact 150 provides another terminal of the transistor 100, for example the source. The contact 131 is connected to the gate 130. There are other minimal feature sizes, such as a minimal size for the well "x," and a minimum distance from the edge of the well to the diffusion area 120 marked as "y." Dimensions, such as "w," "x," and "y" are generally process dependent. Power supply voltage is reduced in correspondence with the minimum feature size to maintain a limit on the electrical field across the oxide. Therefore, power supply voltage has decreased from 3.3V for 0.35-micron CMOS technology to 1.8V for 0.18 micron technology, and is further expected to be at the 1.0V level for 100 nanometers CMOS technology. While power supply voltage decreased, the threshold voltage of the NMOS transistors stayed between 0.45V and 0.35V. The relationship between the NMOS threshold voltage $V_{th}$ and CMOS power supply $V_{DD}$ is known to be very critical. The threshold voltage determines the leakage current, $I_{off}$, of the transistor when it is in its OFF state. As the threshold voltage is driven lower, the leakage current increases.

The drain current of the transistor is a direct function of the overdrive of the transistors, measured as the difference between power supply $V_{DD}$ and threshold voltage $V_{th}$. The drain current of the transistor determines the time required to charge the load capacitance from ground to the level of power supply $V_{DD}$. This overdrive voltage has decreased constantly as the power supply decreased from 3.3V to 1.0V, while threshold voltage decreased only from 0.45V to 0.35V. For the 0.1 micron technology, the threshold voltage of the transistors is being scaled below 0.35V at the expense of very high OFF stage leakage current $I_{OFF}$ which ranges between 10 nA to 100 nA for a transistor with equal gate length and width, or W/L ratio of 1. For a transistor with a gate width to length (W/L) ratio of ten, the OFF current increases to ten times the value stated above, i.e. from 100 nA to 1000 nA. For a CMOS technology of 0.1-micron minimum feature size, a typical VLSI chip is expected to contain over 100 million gates. Given a leakage at every gate of 1 microamperes, there is 100 amperes of leakage current.

A scheme to control the threshold voltage dynamically has been proposed by Takamiya et al. in an article titled *High Performance Electrically Induced Body Dynamic Threshold SOI MOSFET (EIB-DTMOS) with Large Body Effect and Low Threshold Voltage*. Takimiya et al. suggest a scheme that shorts the gate and the substrate of the transistors, thereby causing the substrate voltage of the transistor to increase as the gate voltage is increased for a n-channel MOS (NMOS) transistor. This scheme is proposed for NMOS transistors fabricated on silicon-on-insulator (SOI) substrates, where the transistor substrate is totally isolated. This scheme manipulates the threshold voltage by changing the bias of the substrate in the positive direction for a NMOS transistor, along with a positive signal at the gate. As the substrate to source voltage becomes positive, the depletion layer width is reduced. This results in lower threshold voltage of the transistor, thereby increasing the current from the transistor. In the native form, the Takamiya et al. invention is applicable only for circuits using a power supply voltage of less than 0.6V because this scheme turns on the substrate-to-source diode, and the leakage from this diode must be limited. Otherwise one type of leakage would be traded for another, i.e. from drain-to-source leakage to substrate-to-source leakage. The changes in the threshold voltage of a MOS transistor, upon application of voltage to the substrate or the well region, is known as the body effect. A large body effect allows the changes in threshold voltage to be magnified upon application of bias to the substrate (well).

Douseki in U.S. Pat. No. 5,821,769 describes a method for the control of the threshold voltage of a MOS transistor by connecting a MOS transistor between the gate and the substrate to control the threshold voltage. The Douseki invention requires the addition of another transistor for every transistor whose threshold voltage is dynamically controlled. The adjusted threshold voltage is fixed by the power supply voltage and the threshold voltage of the additional transistor. The area penalty is fairly large for the Douseki invention and it requires additional process steps.

Notably, MOS technology has enabled the increase in the density of semiconductor memory chips with every step of scaling down of the minimum geometry of the transistors. The increase in density has taken place for dynamic random access memory (DRAM), static random access memory (SRAM), and non-volatile memory (NVM) chips. In fact, the memory chips have proven to be a major driver in shrinking geometry of MOS transistors. With the transistor minimum dimension scaled below 100 nanometers, the density of dynamic random access memory has reached four gigabits. The maximum current conducted by the transistor, $I_{ON}$ is not increasing rapidly due to various second order effects that are becoming dominant. As a result, the transistors are being designed with lower threshold voltage $V_{TH}$. This results in the increase of the leakage current $I_{OFF}$.

FIG. 2 illustrates a typical SRAM element, also known as SRAM cell. This cell consists of two cross-coupled CMOS inverters consisting of NMOS transistors 222 and 224 and PMOS transistors 212 and 214. The memory cell is accessed using the pass transistors 226 and 228. These six transistors form a static random access memory. The PMOS transistors are formed in a n-well 232, which is shared by a certain number of SRAM cells. The cell is powered by the power bus, a metal line marked 242, and the ground connection is provided by the bus 244. The data to the cell are read and written by bit lines 246, representing the bit line value itself, and line 248 representing the inverse value of bit line 246, otherwise also know as a bit-line bar.

It is well known to those skilled in the art that SRAM cells, such as the SRAM cells shown in FIG. 2, are critically dependent upon the ratio of $I_{ON}$ to $I_{OFF}$, and a higher value of this ratio is desirable for the stability of the memory cell. With the lowered ratio of $I_{ON}$ to $I_{OFF}$, memory cells are not very stable and are subject to change of their state, or flipping, due to small electrical disturbances. Similarly, DRAM devices are also dependent upon the conducting characteristics of the MOS transistors. In a DRAM, a capacitor for storing the charge is used, and a transistor acts as a gating element to make or break the electrical connection to the capacitor. These pass transistors are designed with a high threshold voltage so that the off current of these transistors is low. This results in lowering of the ON current of these transistors, which leads to decrease in the read and write speed to the DRAM.

A similar problem also exists in other semiconductor memory types, including non-volatile memory, three-transistor SRAM, multi-port SRAM, and other types known to those skilled in the art. Prior art solutions have further attempted to address these issues. However, these approaches have caused significant increases in die area, reduced other beneficial characteristics of the devices, and require changes in the manufacturing process, as well as other limitations. There is therefore a need in the art for a technology which can reduce the leakage of memory cells using deep submicron MOS transistors, without adversely affecting other characteristics of the memory cell. Preferably such a solution will not change standard manufacturing processes and, preferably, such technology will be further applicable to multiple types of memory cells.

SUMMARY OF THE INVENTION

In deep submicron memory arrays there is noted a relatively steady reduction in the on-current value and, therefore, threshold values of the transistors comprising the memory cell are reduced to increase the on-current. This, in turn, results in an increase in the leakage current of the memory cell. With the use of an ever increasing number of memory cells leakage current must be controlled. A method and apparatus using a dynamic threshold voltage control scheme implemented with no more than minor changes to the existing MOS process technology is disclosed. The disclosed invention controls the threshold voltage of MOS transistors. Methods for enhancing the impact of the dynamic threshold control technology using this apparatus are also included. The invention is particularly useful for SRAM, DRAM, and NVM devices.

DETAILED DESCRIPTION OF THE INVENTION

A key aspect of the disclosed invention is the addition of a circuit to the NMOS transistor that results in the increase of the drive current while in an ON state, and reduction of the leakage current while in the OFF state. Specifically, this is achieved by implementing a control circuit between the gate and the substrate of the transistor. The control circuit can be as simple as a resistance, or it can include one or more diodes. Specifically, the circuit forces a high threshold voltage $V_{TH}$ in the OFF state of the NMOS transistor and a low $V_{TH}$ in the ON state of the NMOS transistor. A detailed description of the disclosed invention follows.

Figure 3:
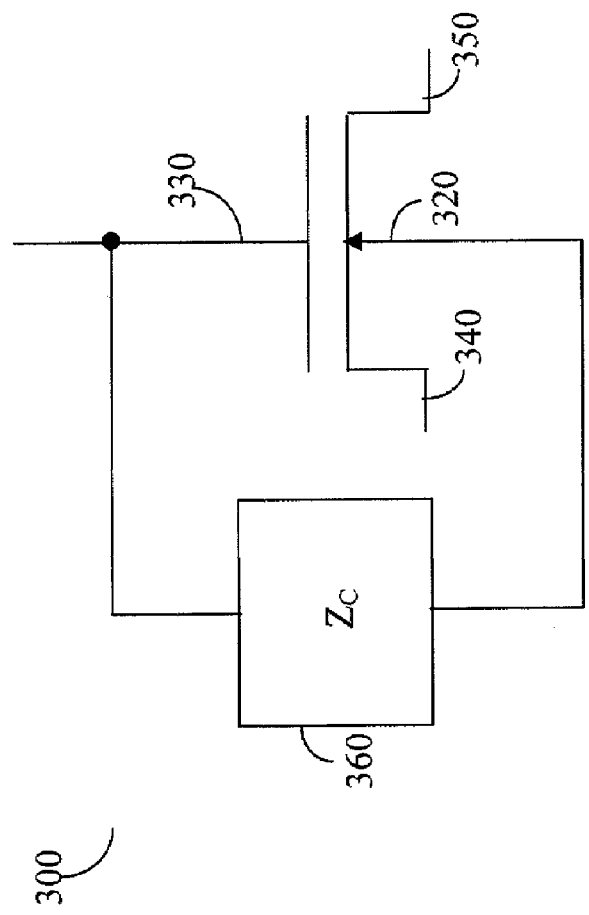
FIG. 3 is a schematic diagram of a threshold control circuit $Z_C$ connected between the gate and substrate terminals of an NMOS transistor in accordance with the disclosed invention.

FIG. 3 provides an exemplary and non-limiting schematic diagram of a circuit 300 in accordance with the disclosed invention. A control circuit $Z_C$ 360 is connected between a gate 330 and a substrate 320 of a NMOS transistor comprising a substrate 320, a gate 330, a drain 340, and a source 350. In accordance with the disclosed invention, the control circuit $Z_C$ implements a dynamic voltage control by using, for example, various types of diodes to control the substrate voltage. By controlling the threshold voltages to be different in the ON and OFF states of the controlled NMOS transistor, improvement in drive current in the ON state and leakage current in the OFF state is achieved. Furthermore, there is provided an extremely area efficient implementation of dynamic threshold voltage control, as described in further detail below.

Figure 1:
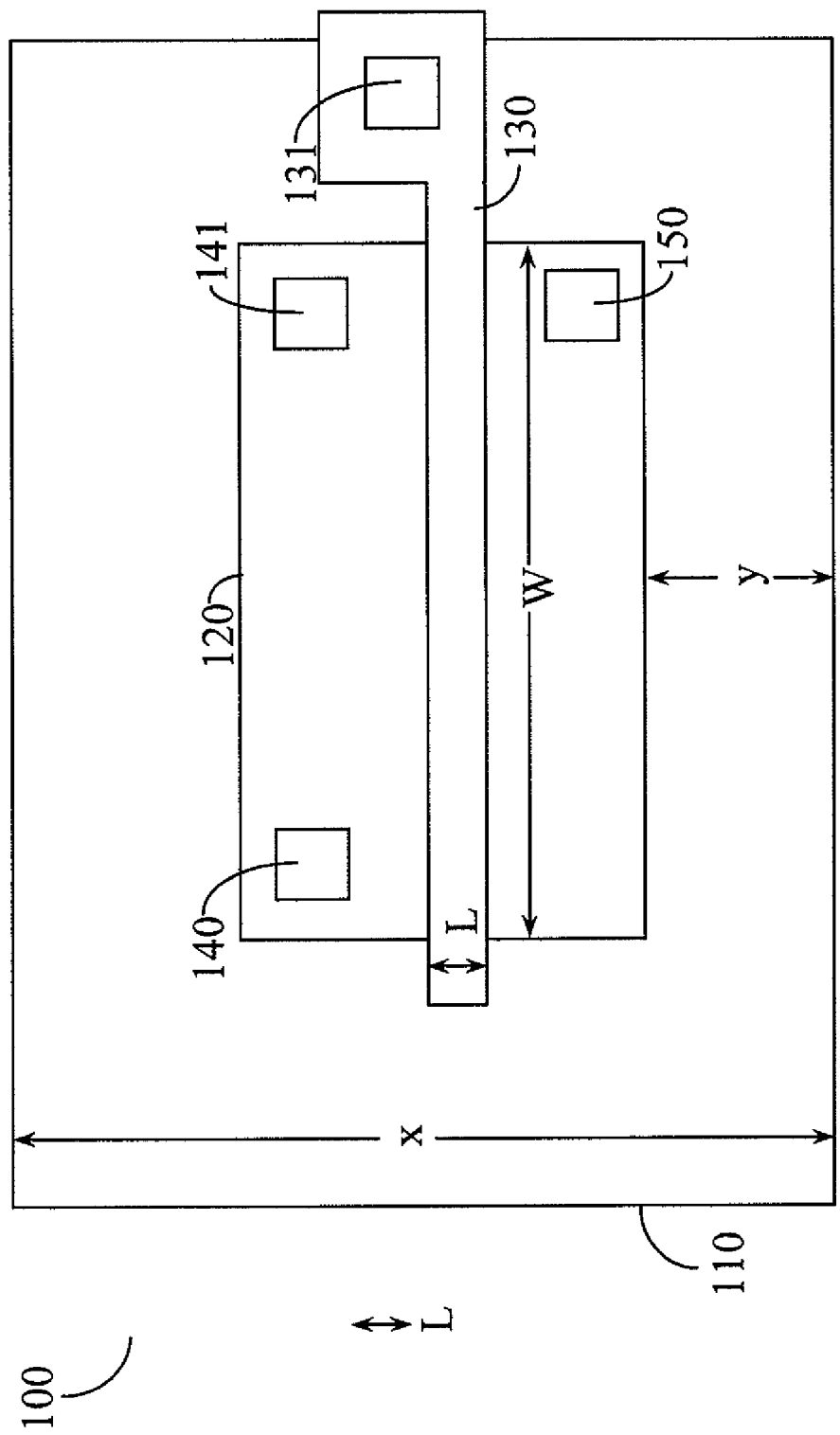
FIG. 1 shows a typical layout of a 0.18 micron transistor.
Figure 2:
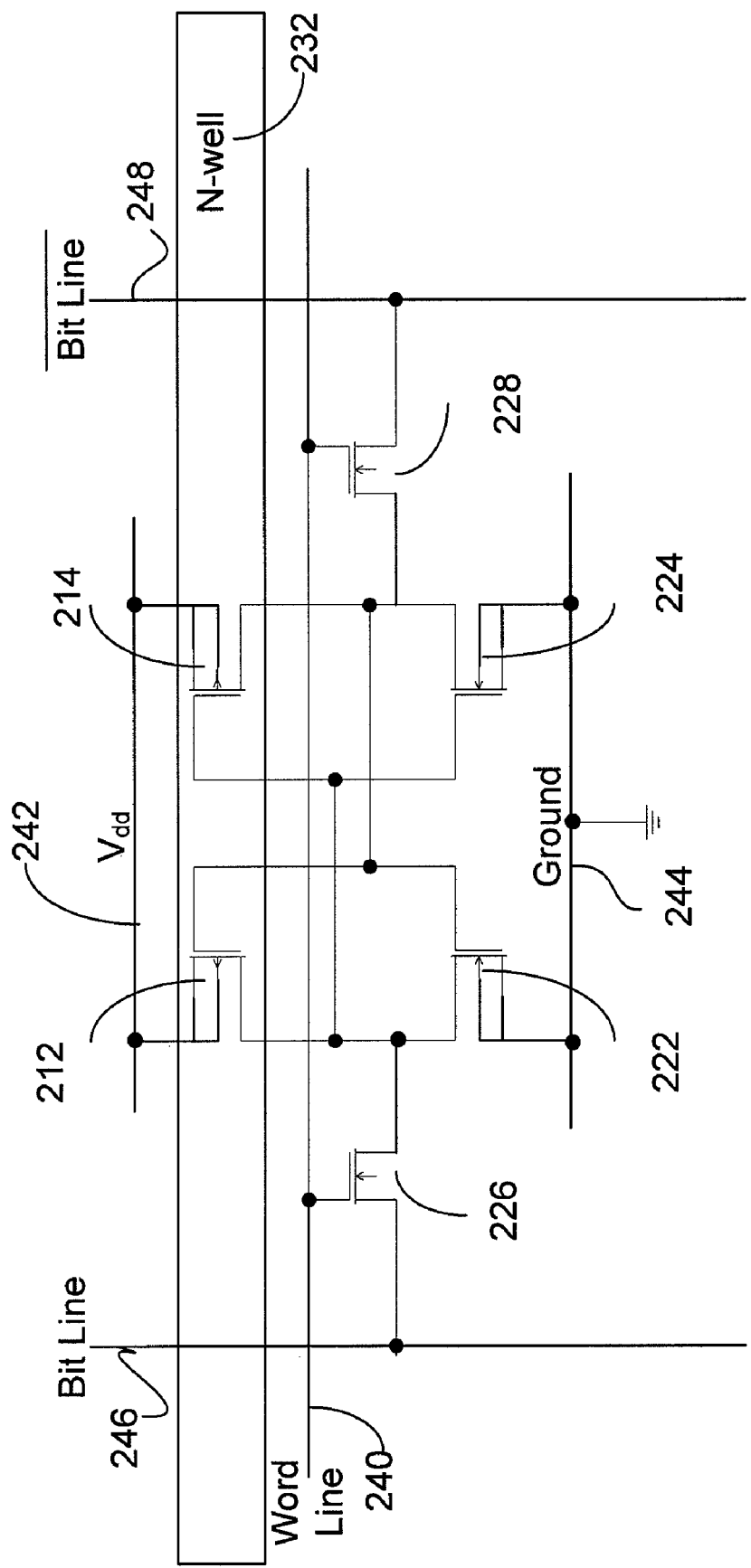
FIG. 2 shows a standard CMOS SRAM cell.
Figure 4:
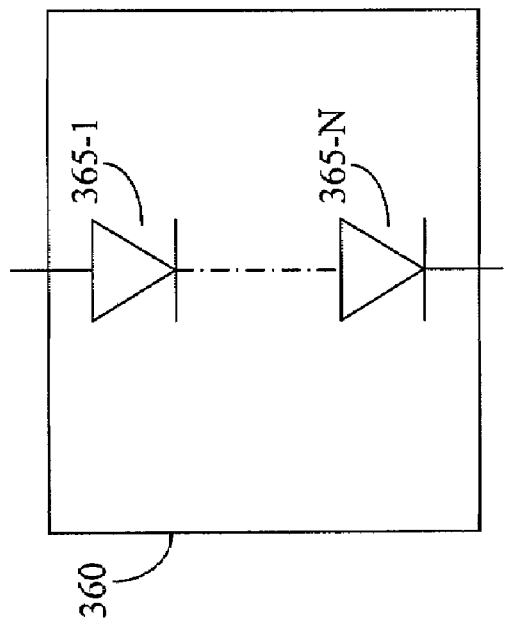
FIG. 4 is a schematic diagram of the threshold control circuit $Z_C$ shown in FIG. 3.

FIG. 4 shows an exemplary control circuit 360 comprised of a plurality of diodes 365. The control circuit 360 may comprise of one or more diodes connected between the gate 330 and the substrate 320 of the NMOS transistor. The dynamically adjusted threshold voltage is varied by adjusting the diode layout geometry. No variations in the manufacturing process are required. The diodes are fabricated in a variety of techniques, as detailed further below, however, in one embodiment of the invention, discussed in more detail below, such variations are shown, and provide additional benefits to the disclosed invention.

One such type of diode is the diffused diode. These diodes are conventional diodes fabricated by diffusing n-type and p-type layers in a completed isolated structure. The voltage across the diodes is controlled by adjusting the doping profiles in silicon and programming the area, thereby controlling the voltage drop across the diode. A more detailed discussion of this apparatus and method may be found in U.S. provisional patent application Ser. No. 60/585,582, filed 7 Jul. 2004, by Dr. Ashok Kapoor, entitled *Apparatus and Method for Improving Drive-Strength and Leakage of Deep Submicron MOS Transistors* (hereinafter the 7 July provisional patent application), which application is assigned to a common assignee, and which application is incorporated herein in its entirety by this reference thereto.

Using the structure described above, the disclosed invention provides a method and apparatus for improving the performance of various semiconductor memory types by dynamically managing the threshold voltage of certain critical transistors in respective memory cells. The disclosure herein concerns typical, but non-limiting, implementations of the invention in respect of static random access memory (SRAM) cells and dynamic random access memory (DRAM) cells. The invention is also applicable to other types of memories, such as multi-port SRAM, and non-volatile memories, such as EEPROM and flash memories.

Figure 5:
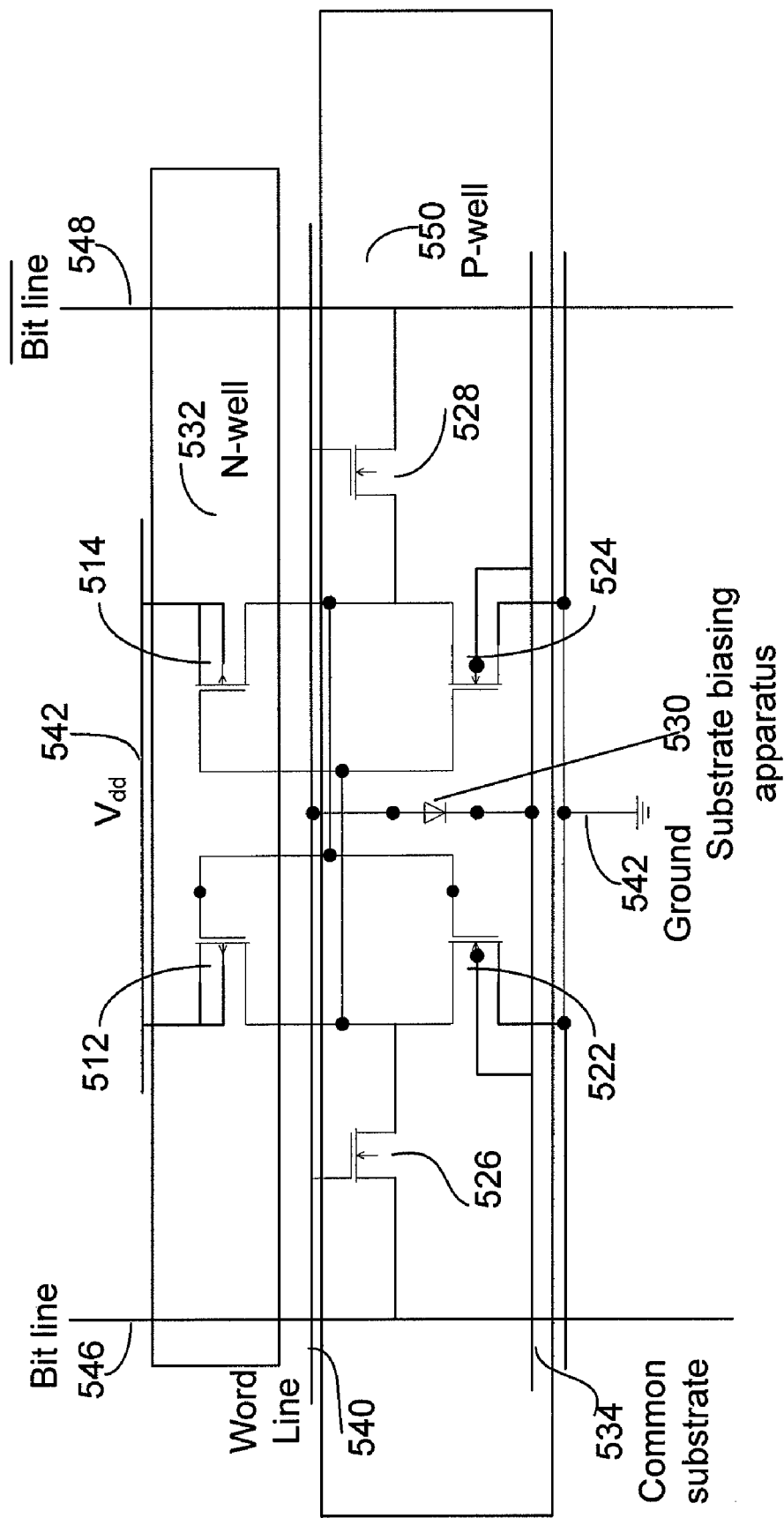
FIG. 5 shows a CMOS SRAM cell having a dynamic threshold control to improve the speed and stability of the cell.

FIG. 5 shows the construction of a SRAM cell with dynamic threshold control. The memory cell is formed by cross coupling of the PMOS transistors 512 and 514, and NMOS transistors 522 and 524. The pass transistors are marked as 526 and 528. The PMOS transistors are formed in n-well 532 that is shared by a number of PMOS transistors in memory cells placed in a row. This is similar to the arrangement of conventional CMOS memory cells. The power to the memory cell is supplied by the power bus 542, and the common ground connection is provided by a metal line 544, both of which run horizontally, as shown in FIG. 5. The data read and write is provided by metal lines 544 and 548.

The additional apparatus enabling the invention is described by a common p-well 550 shared by the NMOS transistors in the cell and by multiplicity of adjacent memory cells in the same row. The NMOS transistors are normally formed in the p-type substrate and share the substrate connection with all other transistors in the chip. Implementation of the dynamic threshold voltage control scheme requires that the NMOS transistors be isolated from other transistor(s) and the substrate. This is achieved in a triple well CMOS process, as is known to those skilled in the art. An alternate embodiment of this feature is achieved by using a method as described herein below. The p-well is used to isolate the memory cells from the rest of the substrate. This invention uses a varying number of memory cells sharing the p-well. The only restriction placed upon the formation of the p-well is that it should be electrically connected. The isolation of p-well is accomplished by placing an n-type layer between the substrate and the NMOS transistors. This n-type layer is formed by any of the conventional means of forming a deep layer of opposite polarity in a silicon chip. An example of such a process step is the formation of an n-layer by deep ion-implant in silicon in the area where NMOS transistors are formed. The ion-implant energy and dose depend upon the remaining process steps used to form the transistor. The n-layer can be formed by ion-implant of atoms of phosphorous at energy of 200 KeV to 5 MeV with the implant dose of $1 \times 10^{11}$ atoms/cm$^2$ to $1 \times 10^{14}$ atoms/cm$^2$.

The invention uses a substrate biasing apparatus 530 for dynamic threshold control, connected from a word line 540 to a p-well 550. This apparatus actively manages the threshold voltage of the NMOS transistors in the p-well, such that the threshold voltage is high when the word line is at zero volts. An advantage of a high threshold voltage of MOS transistor is that it results in low drain-source leakage when there is zero voltage at the gate, and it leads to greater stability of the memory cell. A disadvantage of the high threshold voltage is that the drain current conducted by the transistor is reduced when the transistor is ON. This limitation is reduced, as taught herein, by using an active biasing circuit 530 for controlling the bias at the p-well 550, such that when the voltage on the word line is raised to $V_{DD}$, or is raised high, the voltage at the p-well is also raised without conducting a significant amount of current from the power source. The raising of the voltage at the p-well results in lowering of the threshold voltage of the NMOS transistors in the well. This results in a higher current conducted by the transistors, which results in faster read and write operation of the memory cell. Thus, by using the disclosed dynamic biasing scheme for the memory cell, circuit operation is made more stable and it is also made faster. By sharing the active device for the dynamic control of the threshold voltage between multiple memory cells, the area impact of adding this new threshold voltage control component on the memory cell size is minimized.

As noted above it may be desirable to achieve a large body effect, especially with the application of positive voltage to the substrate region of a NMOS transistor, and a negative voltage to the well region of a PMOS transistor. This is desirable from the standpoint of the disclosed invention because it allows the changes in threshold voltage to be magnified upon application of positive (negative) bias to the substrate (well). To enhance the body effect in the transistors further, a super steep retrograde profile is achieved by suitable process steps, which results in a very rapidly increasing dopant concentration at a certain depth from the surface. To achieve greater reduction in leakage current between the source and drain, as described herein, the super steep retrograde well profile is implemented, where the substrate doping is increased from the low surface doping to a high well doping ranging between $10^{18}$ and $10^{19}$ atoms/cm$^3$ within a depth range of 0.1 micron to 1 micron. This high doping profile results in a very rapidly varying threshold voltage of the MOS transistor upon application of bias on the substrate of the transistor. This property of the MOS transistor is also referred to as very high body effects. This technique is equally applicable to transistors that are the subject matter of the 7 July provisional patent application.

The active device used for the dynamic control of threshold voltage may be a series of diodes, as shown above. The exact number of diodes used in a certain instance depends upon the voltage levels deployed in the circuit. For example, circuits using voltage level between zero and $V_{DD}$, where $V_{DD}$ ranges between 0.7 V and 1.4 V can implement the invention by using a single diode between the word line and the p-well. Implementation of the invention with all its benefits for systems using voltage levels of up to 1.8V may require the use of two diodes in series. The diodes are formed in complete isolation from both the n-well and the p-well. In a preferred embodiment of the invention, the diodes are formed by laterally doped regions of polysilicon on oxide, which is naturally isolated.

Figure 6:
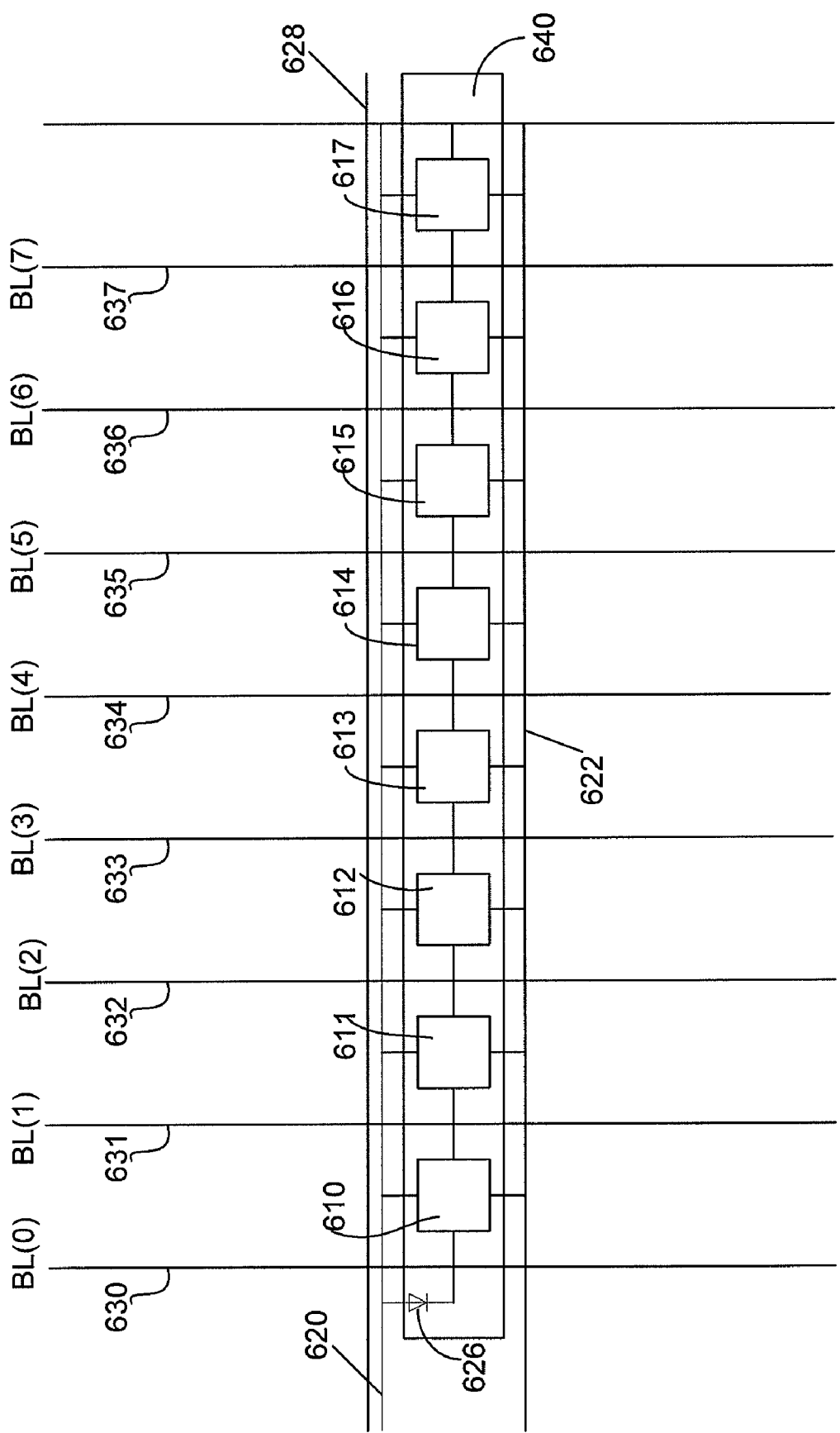
FIG. 6 shows an exemplary implementation of the invention in an array of cells in a SRAM.

FIG. 6 is an exemplary, but not limiting, representation of the disclosed invention, where eight memory cells marked 610 to 617 are formed in a region which has a common p-well region 640. It is not necessary for the implementation of the invention to force the n-wells to implement similar schematic. N-wells can contain lesser or greater number of PMOS transistors, as may be determined by other design constrains known to those skilled in the art. The bit lines connecting the cells are lines 630 through 637. The word line is line 620. For ease of demonstration, the power bus is not shown in FIG. 6. The ground line is line 622. The dynamic biasing of the p-well is implemented by threshold control devices 626, as described in connection with FIG. 3, by connecting the word line and p-well region 640.

Figure 7:
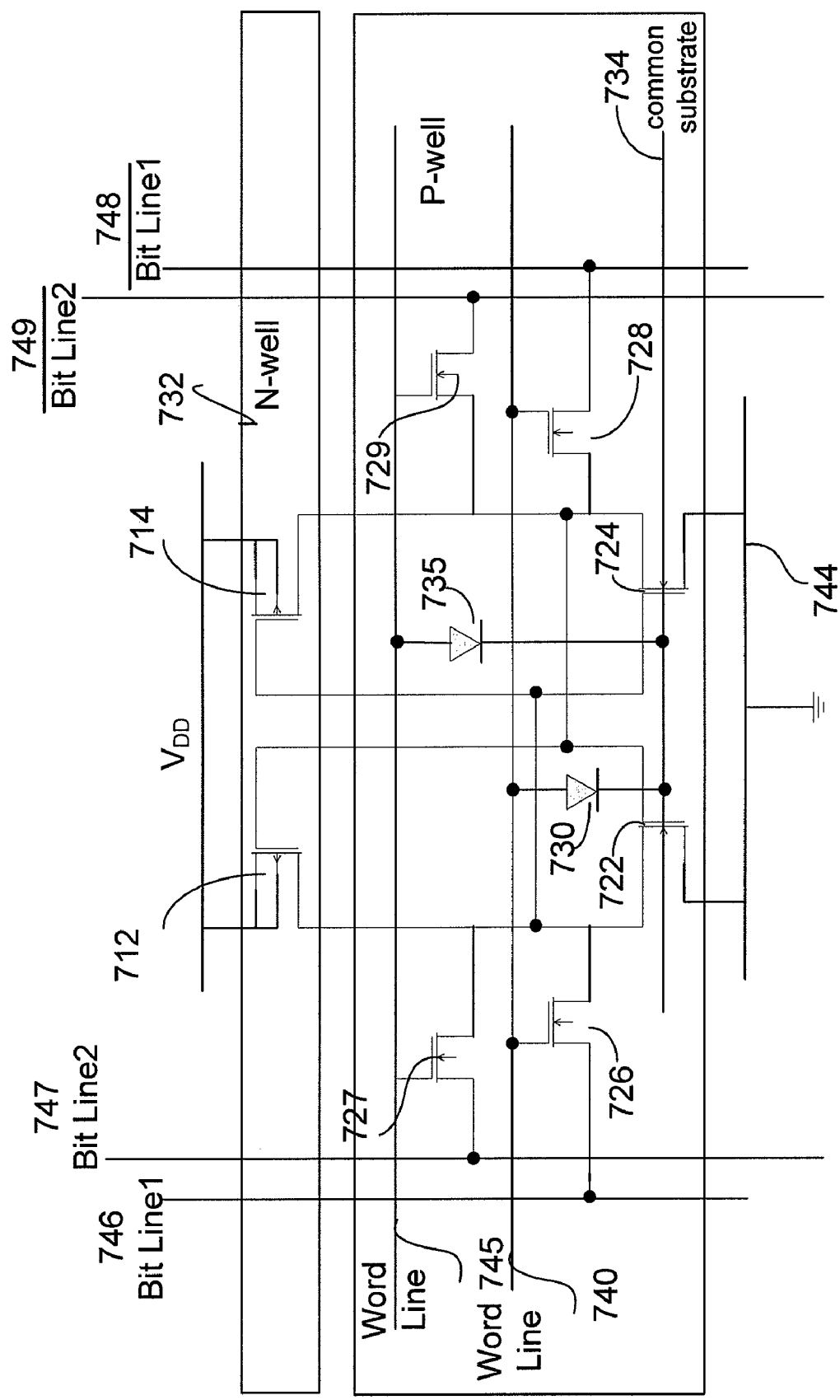
FIG. 7 shows an exemplary implementation of a dual port SRAM with a dynamic threshold control.

FIG. 7 shows an exemplary and non-limiting implementation of the disclosed invention for a dual-port SRAM. While a dual-port implementation is described a person skilled in the art could easily extend this implementation to a multi-port implementation. Because there are two word lines 740 and 745 used, it is necessary to connect two corresponding threshold control circuits 730 and 735 respectively, the circuits further being connected to a common substrate 734. The operation of each word-line itself is identical to the description herein above.

Figure 8:
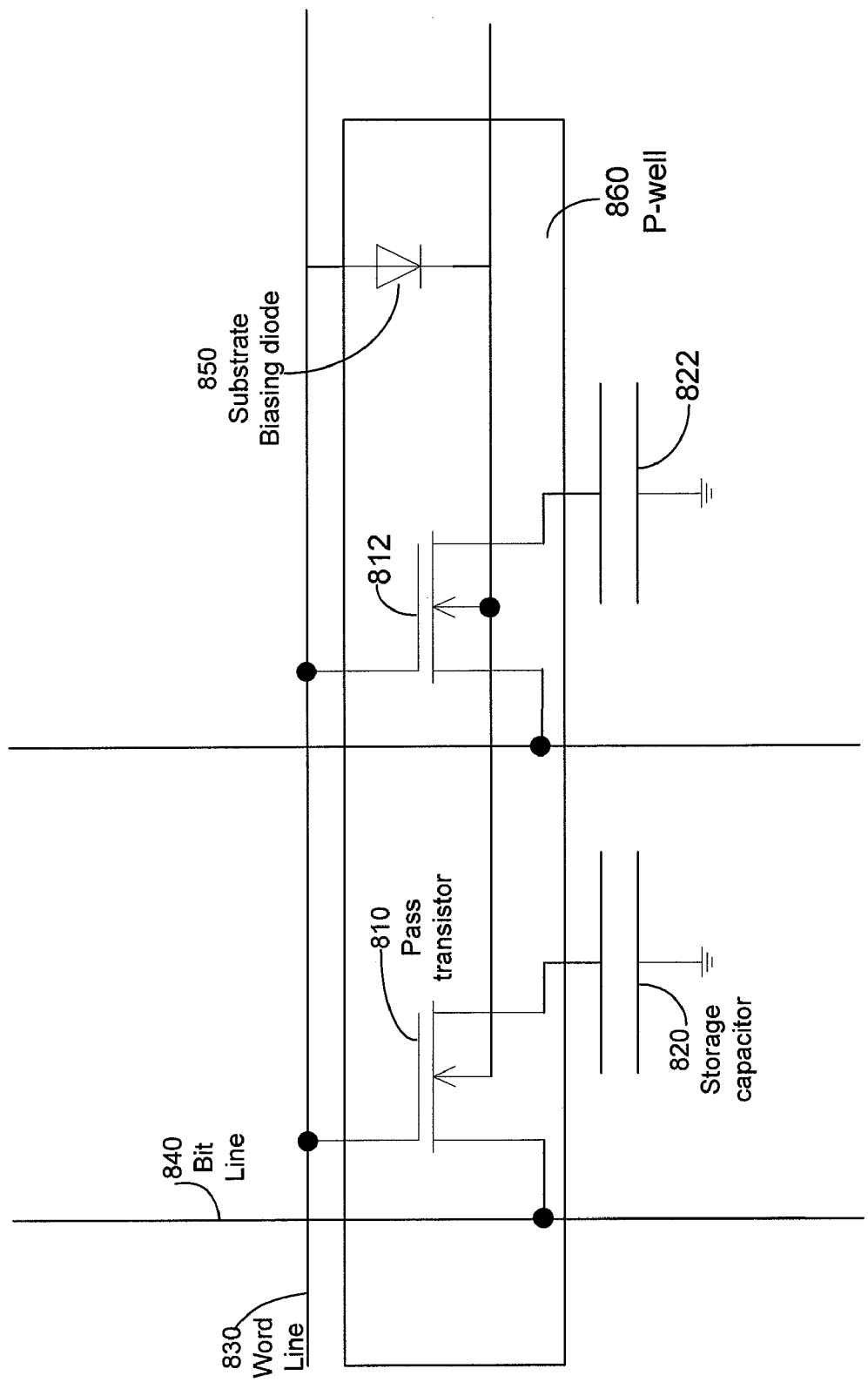
FIG. 8 shows an exemplary DRAM cell with a dynamic threshold control.

FIG. 8 shows an exemplary and non-limiting implementation of the disclosed invention for an array of DRAM cells.

The DRAM consists of an array of pass transistors, e.g. 810 and 812, connected to corresponding storage capacitors. Pass transistors 810 and 812 are further connected to storage capacitors 820 and 822, respectively. The row of pass transistors is addressed by a word line 830. As the word line voltage is raised, the pass transistors 810 and 812 are turned on. The charge on the capacitor is read by the active bit line, e.g. the bit line 840. The intersection of bit line 840 and word line 830 uniquely identifies the charge storage capacitor, e.g. the storage capacitor 820.

The functioning of DRAM is well known to those skilled in the art. With scaling down of the gate length, the pass transistors 810 and 812 suffer from the limitations described above. The operation of the DRAM cell depends, to a certain extent, upon the rate at which data are read from the capacitor, e.g. the storage capacitor 820, and it is written in the capacitor through the pass transistor. The leakage across the drain to source junctions of the pass transistor has to be kept extremely low, on the order of picoamperes, to prevent the charge in the cell from leaking through the pass transistor and causing an error. The DRAM is characterized by regular refresh cycles that are used to refresh the data in the cell because the charge is lost by recombination over time. Leakage of the pass transistor can add another mechanism for the loss of data from the storage capacitor that is likely to increase the need for refresh, or reduce the refresh cycle. This results in less time available for reading or writing to the memory cell.

In accordance with the disclosed invention there is shown a method to maintain the leakage of the pass transistor, e.g. the pass transistors 810 and 812, at a low level and increase the drive strength of the pass transistor simultaneously to speed up the reading and writing of data in the memory cell without sacrificing the stability of the cell. This is achieved by using a dynamic threshold voltage control. This accomplished by designing all the pass transistors in a row in an isolated p-well, separated from the substrate by an n-region. The pass transistors addressed by a word line are placed in the same p-type isolation area. A dynamic biasing element 850 is connected between the word line and the isolation p-well, such that when the word line voltage is increased a fraction of the voltage from the word line is made incident upon the p-well. The voltage of the p-well is kept well below the turn on voltage of the p-substrate to n-source diode of the MOS transistor, and the rise time of this voltage is kept to a minimum by using the active biasing element. For a DRAM built with deep submicron technology on the order of 0.15 micron or below, and operating at voltages equal to or below 1.5V, the active biasing element for the p-well may comprise a bank of diodes connected in series. Multiple diodes are connected in series to restrict the voltage at the p-substrate at 0.5 V, and allow the rest of the voltage drop to take place across the active biasing diodes. As the operating voltage is brought to at or below a voltage ranging between 0.7 and 1.4 V, a single diode can be used to implement the dynamic biasing scheme. The use of diode ensures a very efficient means of actively changing the biasing voltage of the p-well region containing the NMOS transistors.

The schemes disclosed herein are further applicable to other forms of memory cells, such as flash memory, electrically programmable read only memory (EPROM) and electrically erasable programmable read only memory (EEPROM), amongst others. In each of these memory types, the condition of a memory cell is detected by selectively turning on a pass transistor. The operation of these memory types is made more efficient and faster by use of the method of dynamic biasing of the substrate disclosed herein. In each of these cases, the biasing element used for implementing this scheme comprises a series of diodes, dynamically controlling the ON and OFF threshold values, the biasing element being shared by a number of memory cells. This ensures that the additional area needed for implementing the dynamic threshold control is kept to a desirable minimum.

Figure 9:
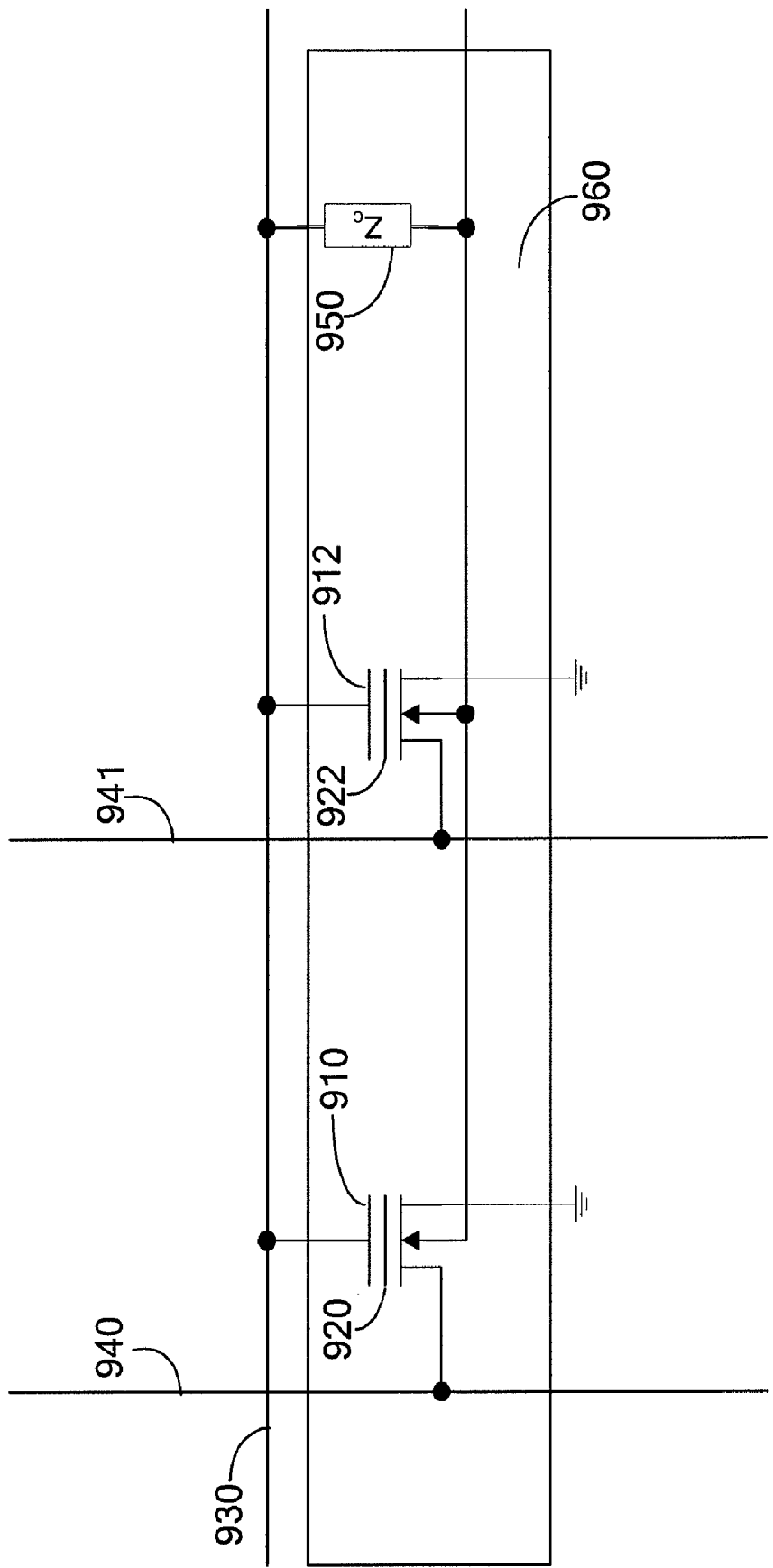
FIG. 9 shows an exemplary non-volatile memory cell with a dynamic threshold control.

FIG. 9 shows an exemplary and non-limiting implementation of the disclosed invention for an array of non-volatile memory (NVM) cells. The NVM consists of an array of storage transistors, e.g. 910 and 912, with floating gates 920 and 922, respectively. The row transistors are addressed by a word line 930. As the word line voltage is raised, transistors with charge stored on the floating gates 910 and 912 are turned on. The current through the transistor is read by the active bit line, e.g. the bit line 940. The intersection of the bit line 940 and the word line 930 uniquely identifies the storage transistor, e.g. the transistor 910 with a floating gate 920. The functioning of NVM is well known to those skilled in the art. With scaling down of the gate length, the pass transistors 910 and 912 suffer from the limitations described above. The operation of the NVM cell depends, to a certain extent, upon the rate at which data are read from the transistor 910. The writing of data on the floating gate uses other programming methods. The read speed of NVM cell is extremely important in determining the speed of operation of the memory. As well, the leakage of the transistor is extremely important because these devices are used in battery operated applications in many instances, and the transistor leakage can result in rapid discharging of the battery.

In accordance with the disclosed invention there is shown a method to maintain the leakage of the NVM transistors 910 and 912 at a low level, and to increase the drive strength of the transistor simultaneously to speed up the reading of data from the memory cell without causing excessive leakage of the memory cell. This is achieved by using a dynamic threshold voltage control, where all the transistors in a row in an isolated p-well are separated from the substrate by an n-region. The transistors addressed by a word line are placed in the same p-type isolation area. A dynamic biasing element 950 is connected between the word line and the isolation p-well, such that when the word line voltage is increased, a fraction of the voltage from the word line is made incident upon the p well. The voltage of the p-well is kept well below the turn on voltage of the p-substrate to n-source diode of the MOS transistor, and the rise time of this voltage is kept to a minimum by using the active biasing element. For an NVM built using deep submicron technology of the order of 0.15 micron or below, and operating at voltages equal to or below 1.5V, the active biasing element for the p-well may comprise a bank of diodes connected in series. Multiple diodes are connected in series to restrict the voltage at the p-substrate at 0.5 V, and to allow the rest of the voltage drop to take place across the active biasing diodes. As the operating voltage is brought to at or below a voltage ranging between 0.7 and 1.4 V, a single diode can be used to implement the dynamic biasing scheme. The use of a diode ensures a very efficient means of actively changing the biasing voltage of the p-well region containing the NMOS transistors.

A person skilled-in-the-art would have noticed that typically, in a representative deep submicron CMOS process using 100 nanometer lithography, there is almost a factor of ten change in leakage current from 0V substrate bias to −1V substrate bias for a PMOS transistor, while there is only a factor of 3-3.5 change in leakage current from 0V to −1V substrate bias for an NMOS transistor. This is due to the fact that the well region of the PMOS transistor is highly doped to counter dope against the diffusion of P+ source and drain. By contrast, the N+ source and drain region of an NMOS transistor are well controlled and, hence, the substrate doping is kept low, which leads to minimal change in leakage with substrate bias. A process change which increases the substrate doping causes the amplification of the effect of the substrate voltage manipulation. Notably, this also results in an increase in the capacitance of the source and drain region. However, this has a minimal impact upon the circuit speed because the load capacitance in a deep submicron CMOS VLSI circuit consists mainly of interconnect capacitance. Therefore, the use of a more highly doped substrate or well region, results in the increase in drain current by forward biasing. Alternately, for the same drain current, the leakage current is decreased. The device characteristics can also be optimized to increase the bulk doping level as well as the gate oxide thickness, so that drain leakage and gate tunneling current is decreased simultaneously.

Although the invention is described herein with reference to the preferred embodiment, one skilled in the art will readily appreciate that other applications may be substituted for those set forth herein without departing from the spirit and scope of the present invention. Accordingly, the invention should only be limited by the Claims included below.

The invention claimed is:

1. A method for manufacturing a deep submicron metal-oxide-semiconductor (MOS) memory apparatus, comprising:
    fabricating at least a memory cell in a row of memory cells comprised of at least a NMOS transistor formed in an isolated p-well; and
    fabricating a control circuit comprised of at least one diode between a word-line of said row of memory cells and a substrate of said isolated p-well, said at least one diode enabled to affect a first threshold voltage of said at least a NMOS transistor when said word-line is at a first potential and enabled to affect a second threshold voltage of said NMOS transistors when said word-line is at a second potential.

2. The method of claim 1, said forming at least one diode step comprising the step of:
    forming any of at least one diffused diode, self-aligned diode, in-line polysilicon diode, and Schottky diode.

3. The method of claim 1, said method further comprising the step of:
    doping the substrate of said at least a NMOS transistor to a level optimized for reduction of at least a leakage current of said at least a NMOS transistor.

4. The method of claim 1, wherein each said memory cell comprising any of:
    a static random access memory (SRAM), a dynamic random access memory (DRAM), and a non-volatile memory (NVM).

5. The method of claim 4, said NVM comprising any of:
    a flash memory, an electrically programmable read-only memory (EPROM), and an electrically erasable programmable read-only memory (EEPROM).

6. The method of claim 4, said control circuit performing the step of:
    reducing a refresh rate of said DRAM.

7. The method of claim 1, said control circuit performing the step of:
    enabling increase of read speed of said memory cell.

8. The method of claim 1, further comprising the step of:
    forming a super steep retrograde well profile.

9. The method of claim 1, further comprising the step of:
    forming an n-layer of said at least a NMOS transistor by ion-implant of atoms of phosphorous at energy of 200 KeV to 5 MeV with an implant dose of $1\times10^{11}$ atoms/cm$^2$ to $1\times10^{14}$ atoms/cm$^2$.

10. The method of claim 9, further comprising the step of:
    increasing substrate doping from a low surface doping to a high well doping ranging between $10^{17}$ and $10^{19}$ atoms/cm$^3$ within a depth range of 0.1 micron to 1 micron from silicon surface.

11. A method for controlling threshold voltage of MOS transistors in a deep submicron metal-oxide-semiconductor (MOS) memory apparatus, comprising the steps of:
    creating a plurality of memory cells each comprised of MOS transistors and organized in a plurality of memory rows, each of said memory rows comprising a word line, said memory cells comprising both PMOS and NMOS transistors, said NMOS transistors formed in at least an isolated p-well over a substrate; and
    creating a control circuit between said word line and a substrate of said isolated p-well of each NMOS transistor, said control circuit effecting a high threshold voltage at each associated NMOS transistor when an associated word-line is at a relatively low potential and effecting a low threshold voltage at said associated NMOS transistor when said associated word-line is at a relatively high potential;
    wherein the threshold voltage of said each NMOS transistor dynamically changes its threshold voltage responsive a potential of said associated word-line.

12. The method of claim 11, wherein said method further comprises the step of:
    doping said substrate of said MOS transistor to a level optimized for the reduction of at least the leakage current.

13. The method of claim 11, wherein said memory cell is a static random access memory (SRAM).

* * * * *